US007372748B2

(12) United States Patent
Nandi

(10) Patent No.: US 7,372,748 B2
(45) Date of Patent: May 13, 2008

(54) VOLTAGE REGULATOR IN A NON-VOLATILE MEMORY DEVICE

(75) Inventor: Prajit Nandi, Karnataka (IN)

(73) Assignee: Sandisk Corporation, Milpitas, CA (US)

(*) Notice: Subject to any disclaimer, the term of this patent is extended or adjusted under 35 U.S.C. 154(b) by 0 days.

(21) Appl. No.: 11/549,885

(22) Filed: Oct. 16, 2006

(65) Prior Publication Data

US 2008/0089141 A1  Apr. 17, 2008

(51) Int. Cl.
G11C 16/30 (2006.01)
G11C 5/14 (2006.01)
G05F 1/10 (2006.01)
G05F 3/02 (2006.01)
G05F 3/16 (2006.01)
G05F 3/20 (2006.01)

(52) U.S. Cl. .................. 365/189.09; 365/226; 327/540; 323/313; 323/315

(58) Field of Classification Search .......... 365/189.11, 365/189.09, 189.07, 189.06, 185.18, 226; 327/541, 540; 323/317, 316, 315, 313
See application file for complete search history.

(56) References Cited

U.S. PATENT DOCUMENTS

| 4,670,861 | A | * | 6/1987 | Shu et al. ................. 365/181 |
| 5,570,315 | A | | 10/1996 | Tanaka et al. |
| 5,774,397 | A | | 6/1998 | Endoh et al. |
| 6,046,935 | A | | 4/2000 | Takeuchi et al. |
| 6,373,746 | B1 | | 4/2002 | Takeuchi et al. |
| 6,456,528 | B1 | | 9/2002 | Chen |
| 6,522,580 | B2 | | 2/2003 | Chen et al. |
| 6,771,536 | B2 | | 8/2004 | Li et al. |
| 6,781,877 | B2 | | 8/2004 | Cernea et al. |
| 6,815,941 | B2 | * | 11/2004 | Butler ....................... 323/313 |
| 6,876,182 | B1 | | 4/2005 | Aude |
| 2002/0196692 | A1 | | 12/2002 | Fiscus |
| 2003/0147278 | A1 | | 8/2003 | Tanaka et al. |
| 2004/0150381 | A1 | | 8/2004 | Butler |
| 2004/0245977 | A1 | | 12/2004 | Tran |
| 2005/0134242 | A1 | | 6/2005 | Gradinariu |

OTHER PUBLICATIONS

Rincon-Mora, et al., "A low voltage, low quiescent current, low drop-out regulator", *IEEE Journal of Solid State Circuits*, vol. 33, No. 1, Jan. 1998, 36-44.

Rincon-Mora, Gabriel A., et al., "Current Efficient, Low Voltage, Low Drop Out Regulator", *PhD Thesis; Georgia Institute of Technology 1996*.

* cited by examiner

*Primary Examiner*—J. H. Hur
(74) *Attorney, Agent, or Firm*—Klein, O'Neill & Singh, LLP; Tejinder Singh

(57) ABSTRACT

System and method for controlling voltage in a non-volatile memory system is provided. The system includes a voltage regulator that monitors an output voltage (VDD) and a mirror voltage (Vmirror). When the voltage VDD is greater than the voltage Vmirror beyond a threshold value, a control signal turns off a control transistor, which prevents the voltage VDD to increase beyond a certain value. The method includes comparing an output voltage (VDD) with a mirror voltage (Vmirror); and generating a control signal to turn off a control transistor if the voltage VDD is greater than the voltage Vmirror.

4 Claims, 5 Drawing Sheets

VOLTAGE REGULATOR IN A NON-VOLATILE MEMORY DEVICE

CROSS-REFERENCE TO RELATED APPLICATIONS

None

BACKGROUND

1. Field of the Invention

The present invention relates generally to non-volatile memory devices and particularly, to voltage regulators used in non-volatile memory devices.

2. Background of the Invention

Non-volatile semiconductor memory devices have become popular for use in various electronic devices. For example, non-volatile semiconductor memory (including Electrical Erasable Programmable Read Only Memory (EE-PROM) and flash memory) is used in cellular telephones, digital cameras, personal digital assistants, mobile computing devices and other electronic devices.

Voltage regulators are commonly used to regulate internal voltage in non-volatile memory systems, for example, in a NAND based flash memory system. A typical voltage regulator provides an output voltage (VDD) based on an externally provided input voltage (VEXT). Typically, VDD is used by various components within the memory system.

Conventional voltage regulators have inherent drawbacks. For example, the regulated output voltage is susceptible to load current variations. In conventional systems, if a load current is lower than a specified value then the output voltage from the voltage regulator increases substantially. To limit this effect, typically, a current sink is provided at an output node of the voltage regulator. The current sink increases power consumption in the voltage regulator, which is not desirable in high-density flash memories.

Furthermore, VDD spikes during start-up operation of the memory system, because an output transistor is always on. This may cause undesirable stress for plural circuit components.

Therefore, there is a need for a method and system for better controlling output voltage in voltage regulators.

SUMMARY OF THE INVENTION

In one aspect of the present invention, a system for controlling voltage in a non-volatile memory system is provided. The system includes a voltage regulator that monitors an output voltage (VDD) and a mirror voltage (Vmirror). When the voltage VDD is greater than the voltage Vmirror beyond a threshold value, a control signal turns off a control transistor, which prevents the voltage VDD to increase beyond a certain value.

In another aspect of the present invention, a method for controlling voltage in a non-volatile memory system is provided. The method includes comparing an output voltage (VDD) with a mirror voltage (Vmirror); and generating a control signal to turn off a control transistor, if the voltage VDD is greater than the voltage Vmirror.

In yet another aspect of the present invention, a voltage regulator for a non-volatile memory system is provided. The voltage regulator includes an amplifier that monitors an output voltage (VDD) and a mirror voltage (Vmirror). When the voltage VDD is greater than the voltage Vmirror beyond a threshold value, a control signal turns off a control transistor, which prevents the voltage VDD to increase beyond a certain value.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing and other features of the preferred embodiments will now be described with reference to the drawings. In the drawings, the same components have the same reference numerals. The illustrated embodiments are intended to illustrate, but not to limit the invention. The drawings include the following Figures.

DETAILED DESCRIPTION OF THE PREFERRED EMBODIMENT

In one aspect of the present invention, a circuit for a voltage regulator is provided. The circuit includes a control transistor and a differential amplifier, which reduces dependency of output voltage on load current and reduces overall power consumption.

To facilitate an understanding of the preferred embodiment, the general architecture and operation of a non-volatile memory system/typical voltage regulator will first be described. The specific architecture and operation of the other embodiments will then be described with reference to the general architecture.

Example Non-Volatile Memory System

Figure 1A:
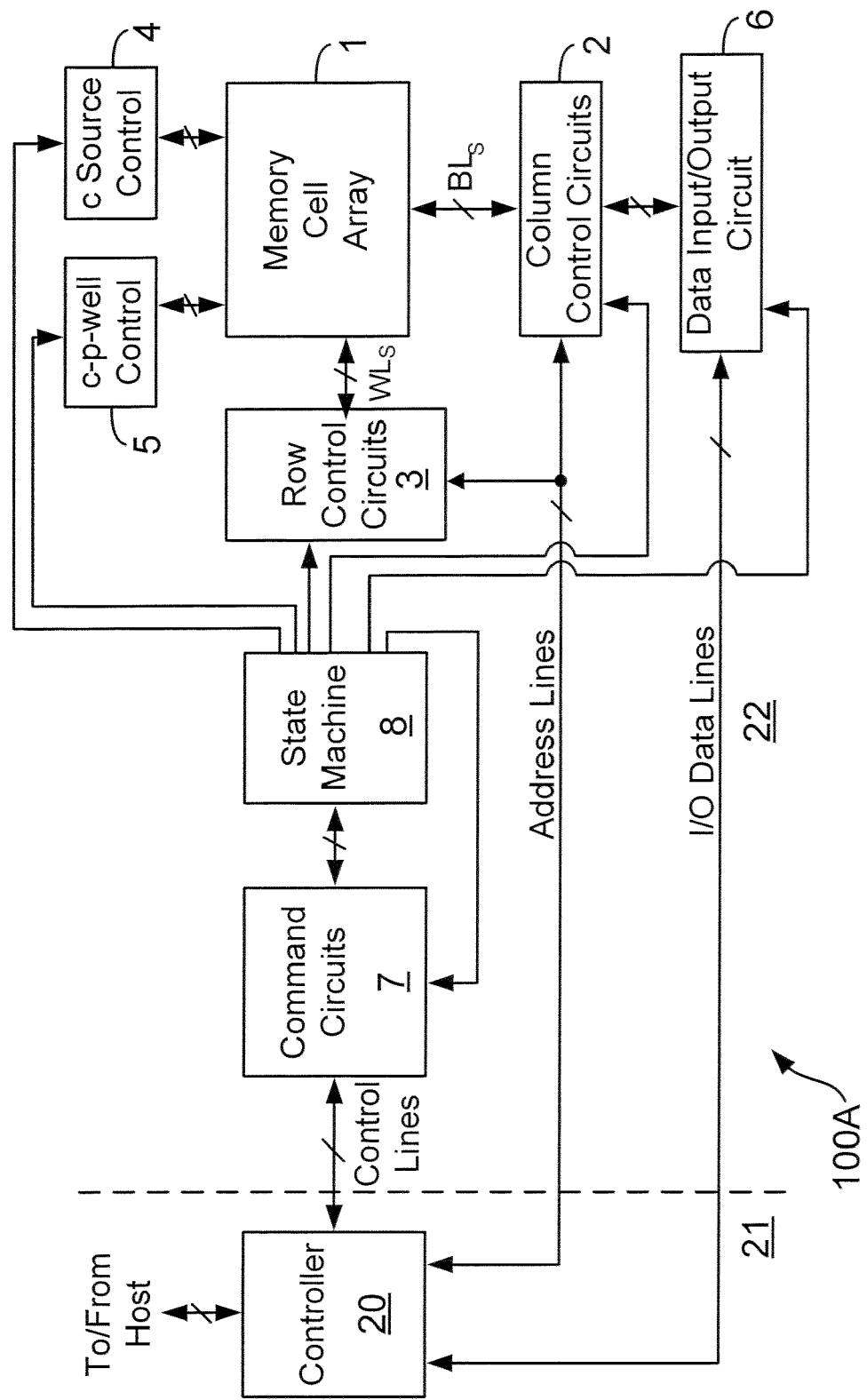
FIG. 1A shows a block diagram of a non-volatile memory system of an embodiment.

With reference to FIG. 1A, a specific non-volatile memory system is described in which the various aspects of the present invention are implemented. FIG. 1A is a block diagram of a flash memory system 100A. Memory cell array 1 including a plurality of memory cells M arranged in a matrix that is controlled by a column control circuit 2, a row control circuit 3, a c-source control circuit 4 and a c-p-well control circuit 5.

A NAND architecture of the memory cell arrays is currently preferred, although other architectures, such as NOR, can also be used instead. Examples of NAND flash memories and their operation as part of a memory system may be had by reference to U.S. Pat. Nos. 5,570,315, 5,774,397, 6,046,935, 6,373,746, 6,456,528, 6,522,580, 6,771,536 and 6,781,877 and U.S. patent application publication No. 2003/0147278.

Column control circuit 2 is connected to bit lines (BL) of memory cell array 1 for reading data stored in the memory cells (M), for determining a state of the memory cells (M)

during a program operation, and for controlling potential levels of the bit lines (BL) to promote programming or to inhibit programming. Row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line connected to the memory cells (M). The c-p-well control circuit 5 controls the c-p-well voltage.

Data stored in memory cells (M) are read out by column control circuit 2 and are output to external I/O lines via an I/O line and a data input/output buffer 6. Program data to be stored in the memory cells are input to the data input/output circuit (or "buffer") 6 via the external I/O lines, and transferred to the column control circuit 2. The external I/O lines are connected to a controller 20.

Command data for controlling the flash memory device are input to a command interface) connected to external control lines that are connected with controller 20. The command data informs the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data for the flash memory such as READY/BUSY or PASS/FAIL signals.

Controller 20 is connected or connectable with a host system such as a personal computer, a digital camera, or a personal digital assistant. It is the host that initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array.

A typical memory system includes one integrated circuit chip 21 that includes controller 20, and one or more integrated circuit chips 22 that each contains a memory array and associated control, input/output and state machine circuits. The trend, of course, is to integrate the memory array and controller circuits of a system together on one or more integrated circuit chips.

The memory system may be embedded as part of the host system, or may be included in a memory card that is removably insertable into a mating socket of host systems. Such a card may include the entire memory system, or the controller and memory array, with associated peripheral circuits, may be provided in separate cards.

Figure 1C:
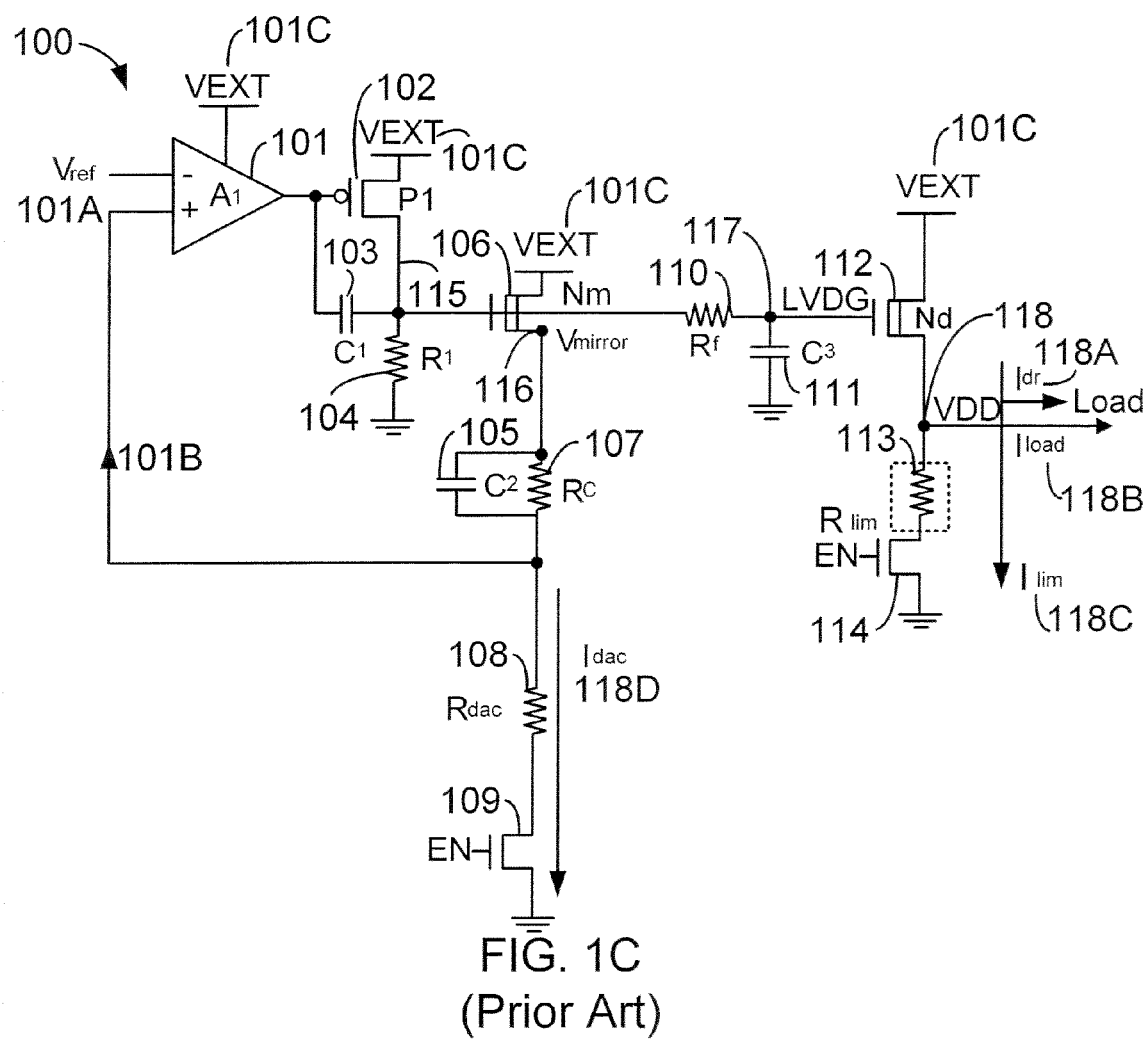
FIG. 1C shows a circuit diagram of a conventional "Voltage Replica Feedback Regulator"
Figure 1B:
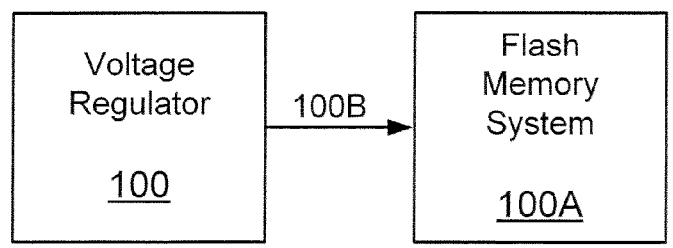
FIG. 1B shows a block diagram of a voltage regulator operationally coupled to a memory system of an embodiment.

FIG. 1B shows a top-level block diagram of a memory system where a voltage regulator 100 provides output voltage (VDD) via power bus 100B. VDD is used by plural components within flash memory system 100A.

Typical Voltage Regulator

FIG. 1C shows a circuit diagram of a conventional voltage regulator 100. Voltage regulator 100 includes an operational amplifier 101, transistors P1 (positive channel metal oxide semiconductor ("PMOS") 102, Nm (negative channel metal oxide semiconductor (NMOS) 106, T1 109, and T2 114, capacitors C1 103, C2 105, and C3 111, and resistors, R1 104, Rc 107, Rdac 108, Rf 110, and Rlim 113.

An external reference voltage, Vref 101A is provided as an inverting input to amplifier 101. A digital analog converter (DAC) (not shown) supplies Vref (101A). Amplifier 101 also receives input 101B, which is a feedback voltage signal, as described below. VEXT (101C) is an external voltage supplied by an external source (not shown).

Regulator 100 operates by using a voltage controlled current source transistor, Nm (NMOS) 106, which is used to force a desired voltage to appear at Vmirror node 116 (also referenced as Vmirror 116 or voltage Vmirror 116). Vmirror 116 is coupled to the gate of transistor Nd 112 (a depletion type, NMOS transistor) via a RC network that includes Rf 110 and C3 111. The RC network intends to reduce voltage spikes at Nd 112.

Amplifier 101 monitors Vmirror 116 by evaluating the voltage drop at resistor Rdac 108. Serially connected resistors Rc 107, Rdac 108 and transistor T1 109 (NMOS) between the source of Nm 106 and ground (GND) form a voltage divider. Ratio of resistors Rdac 108 and Rc 107, together with external reference voltage (shown as Vref 101A) provide the value of Vmirror 106.

The value of Vmirror 106 may be expressed by Equation (1):

$$V\text{mirror}=V\text{ref}(1+Rc/Rdac) \quad (1)$$

Amplifier 101 via PMOS transistor P1 102 and resistor R1 104, controls the current source of transistor Nm 106. Capacitor (C1) 104 is connected between the source and the gate of transistor P1 102 to eliminate noise.

Since there is no current flow to the gate of Nd 112, voltage LVDG, at node 117, is equal to the gate voltage of Nm 115. Therefore, output voltage VDD 118 mirrors the voltage Vmirror 116. Hence, the name "Voltage Replica Feedback Regulator" may be used for voltage regulator 100.

Output voltage VDD 118 follows the behavior described by Equation (1) when current Idr (118A) is n fold of current Idac (118D), as described by Equation (2):

$$Idr=n*Idac \quad (2)$$

where n is the ratio of transistor sizes as expressed by Equation (3):

$$n=(Nd)/(Nm) \quad (3)$$

where (Nd) and (Nm) are the sizes of transistors Nd 112 and Nm 106 respectively; and Idr is the current supplied by Nd 112 and may be expressed by Equation (4) below:

$$Idr=Iload\ (118B)+Ilim\ (118C) \quad (4)$$

When the load current Iload (118B) differs from a targeted value, creating conditions where Equation (2) no longer holds true, then VDD 118 no longer mirrors Vmirror 116. The relationship between VDD and Vmirror may be described by Equations (5) and (6):

$$VDD>V\text{mirror if } I_{DR}<n*Idac \quad (5)$$

$$VDD<V\text{mirror if } I_{DR}>n*Idac \quad (6)$$

Resistor Rlim 113 is connected to the source of Nd 112, providing a parallel current branch to the load. This is meant to prevent a substantial increase in VDD when load current (118B) is less than a target value.

Transistor T1 109 and T2 114 are provided to disable current flow from transistors Nm 106 and Nd 112.

Regulator 100 has drawbacks. For example, VDD 118 increases when the load current decreases. This creates an undesirable potential gradient in power bus 100B (FIG. 1B).

The limiter current 118C may be 2 mA, which wastes power. Current 118C also limits the maximum value of load current 118A at a particular regulated VDD 118.

Furthermore, if power supply ramps up and gate of Nd 112 is at zero volts, VDD 118 increases, i.e., even if Nd 112 is not turned on. This may result in an undesirable voltage spike at power bus 100B.

Voltage Regulator with Differential Amplifier

Figure 2A:
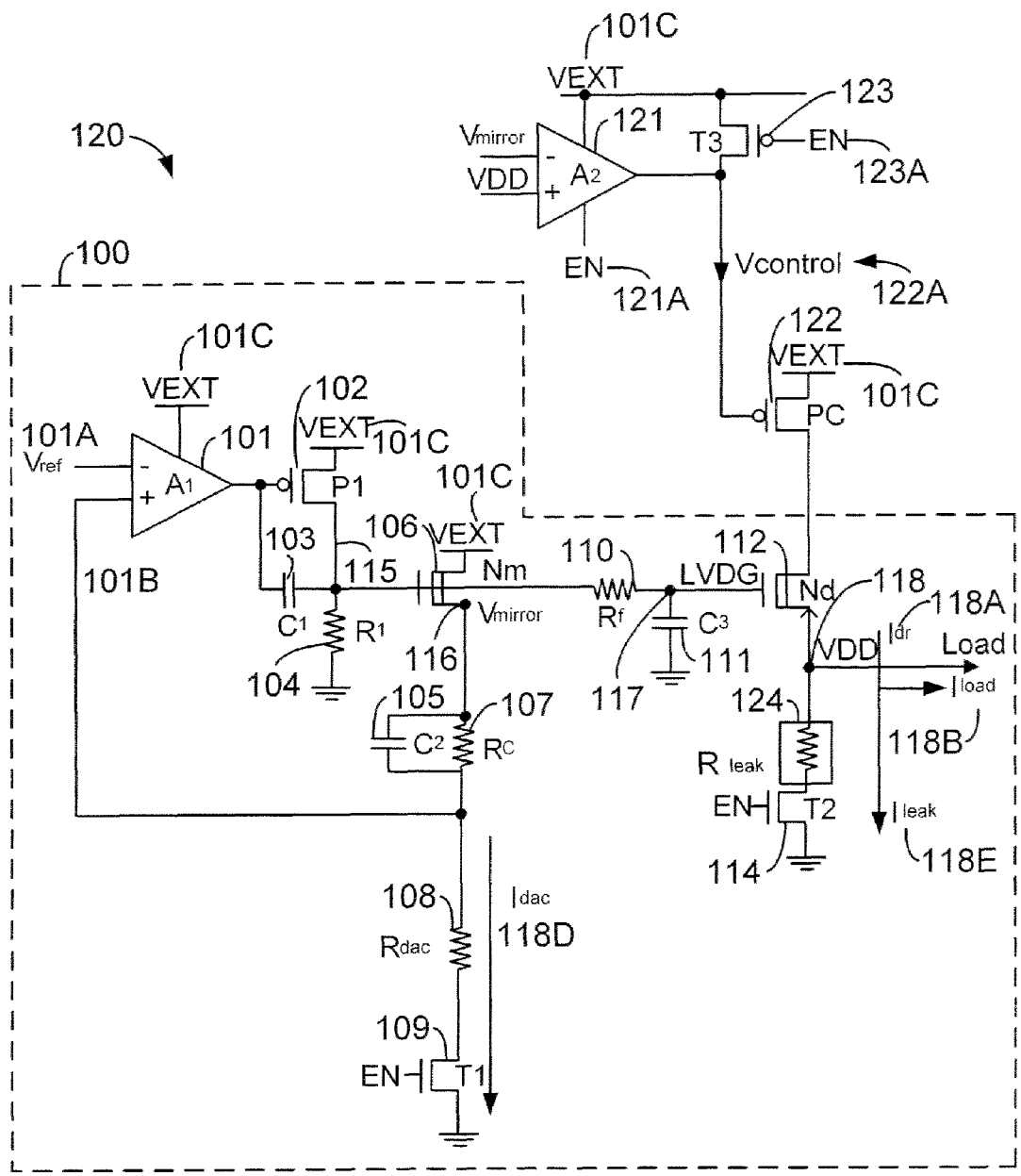
FIG. 2A shows a schematic diagram of a voltage regulator of an embodiment.

FIG. 2A shows a voltage regulator circuit 120, according to one aspect of the present invention. Voltage regulator 120 includes circuit 100 (as described above with respect to FIG. 1C), transistors PC 122 and T3 123, and a differential amplifier (shown as A2 121) (may also be referred to as Amplifier 121).

In one aspect, transistor 122 (may also be referred to as "control transistor") is a PMOS transistor. Transistor 122 is inserted between the drain of transistor Nd 112 and VEXT 101C. Differential amplifier 121 controls the overall operation of transistor 122 that controls transistor 112

Amplifier 121 monitors the difference between Vmirror 116 and VDD 118 and generates signal Vcontrol 122A. Vcontrol 122A controls the operation of transistor 122. Amplifier 121 is enabled by a control signal 121A generated by state machine 8 (FIG. 1A).

When VDD 118 starts rising due to lower than targeted load current (118B), the impedance of transistor 122 increases (i.e. Vcontrol 122A goes high) Transistor 122 is turned "off" and this prevents VDD 118 to exceed Vmirror 116. Since VDD 118 is controlled by transistor 122, resistor Rlim 113 (FIG. 1C) is not used. Resistor, Rleak 124, which is used for circuit stability, replaces Rlim 113. The value of Rleak 124 may be higher than Rlim.

Current Ileak (118E) through Rleak 124 has negligible contribution to the overall regulator power consumption. Ileak 118E improves the maximum value of load current (Iload 118B) at a particular regulated VDD 118.

Transistor T3 123 (PMOS) is connected between VEXT 101C and output of amplifier 121. When VDD 118 is not needed, Amplifier 121 and transistor PC 122 are shut down to save power. Signal 123A is used to enable/disable transistor 123.

Behavior of VDD as a function of load current may be expressed by Equations (7), (8), and (9):

$$VDD = Vmirror \text{ if } IDR = n*Idac \quad (7)$$

$$VDD = Vmirror \text{ if } IDR < n*Idac \quad (8)$$

$$VDD < Vmirror \text{ if } IDR > n*Idac \quad (9)$$

$$\text{where } IDR = Iload + Ileak \quad (10)$$

Figure 2B:
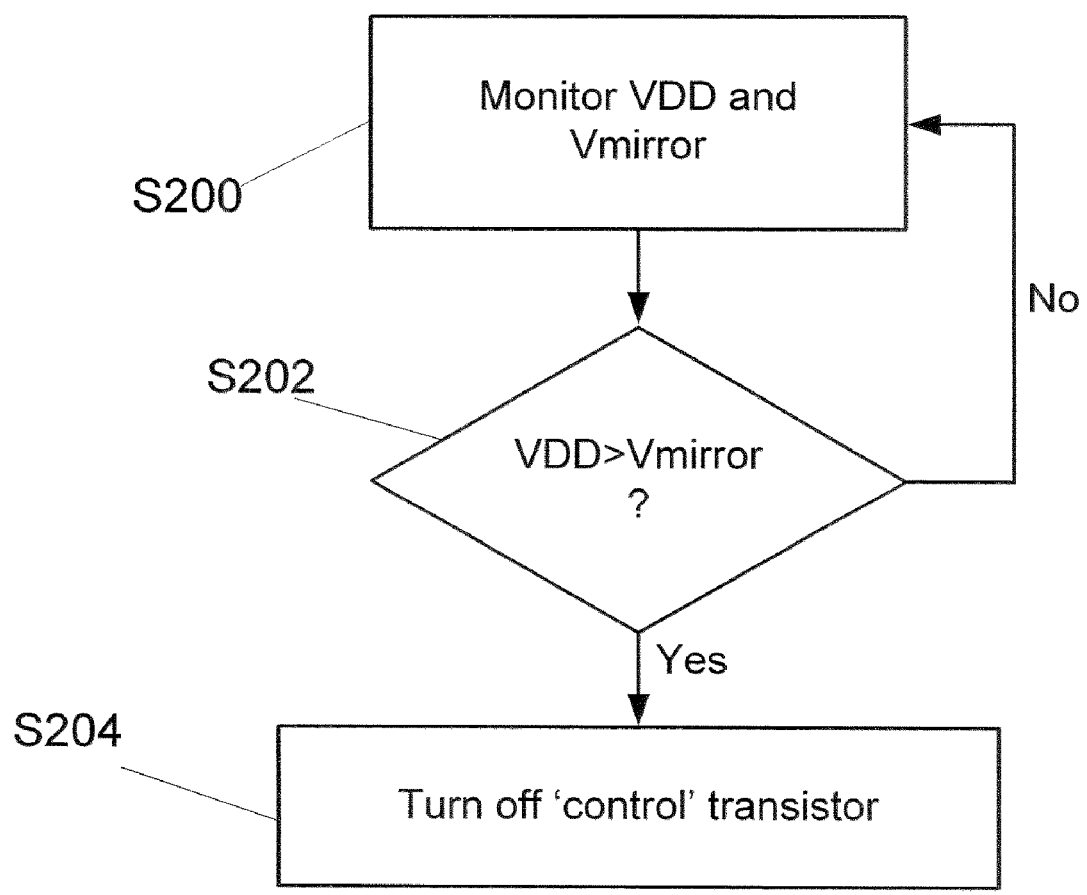
FIG. 2B shows a process flow diagram for using voltage regulator of FIG. 2A.

FIG. 2B shows a flow diagram for controlling VDD by using transistor 122. The process begins in step S200, when amplifier 121 monitors voltage levels for Vmirror 116 and VDD 118.

In step S201, the process determines if VDD 118 is greater than Vmirror 116. A threshold value may be programmed and used as a tolerable difference between VDD 118 and Vmirror 116. If VDD 118 is not greater than Vmirror 116, then the process simply continues to monitor in step S200.

If VDD 118 is greater than Vmirror 116, then in step S202, control transistor 122 is turned off and this prevents VDD 118 from increasing beyond an acceptable level. This controls VDD without using a limiter circuit of FIG. 1C.

In one aspect of the present invention, output voltage is no longer dependent on the minimum value of current loading. VDD 118 is controlled by transistor 122 that is controlled by signal Vcontrol 122A from amplifier 121.

In another aspect, the use of leak current (Ileak) improves the maximum value of load current at a particular VDD value.

In yet another aspect, power consumption by the regulator is reduced, because when VDD is not needed, transistor 122 is turned off.

In another aspect, because drain of transistor 112 is controlled by transistor 122, there is minimal spike on the VDD bus (100B, FIG. 1B), even if there is a steep rise in VEXT 101C.

Figure 3:
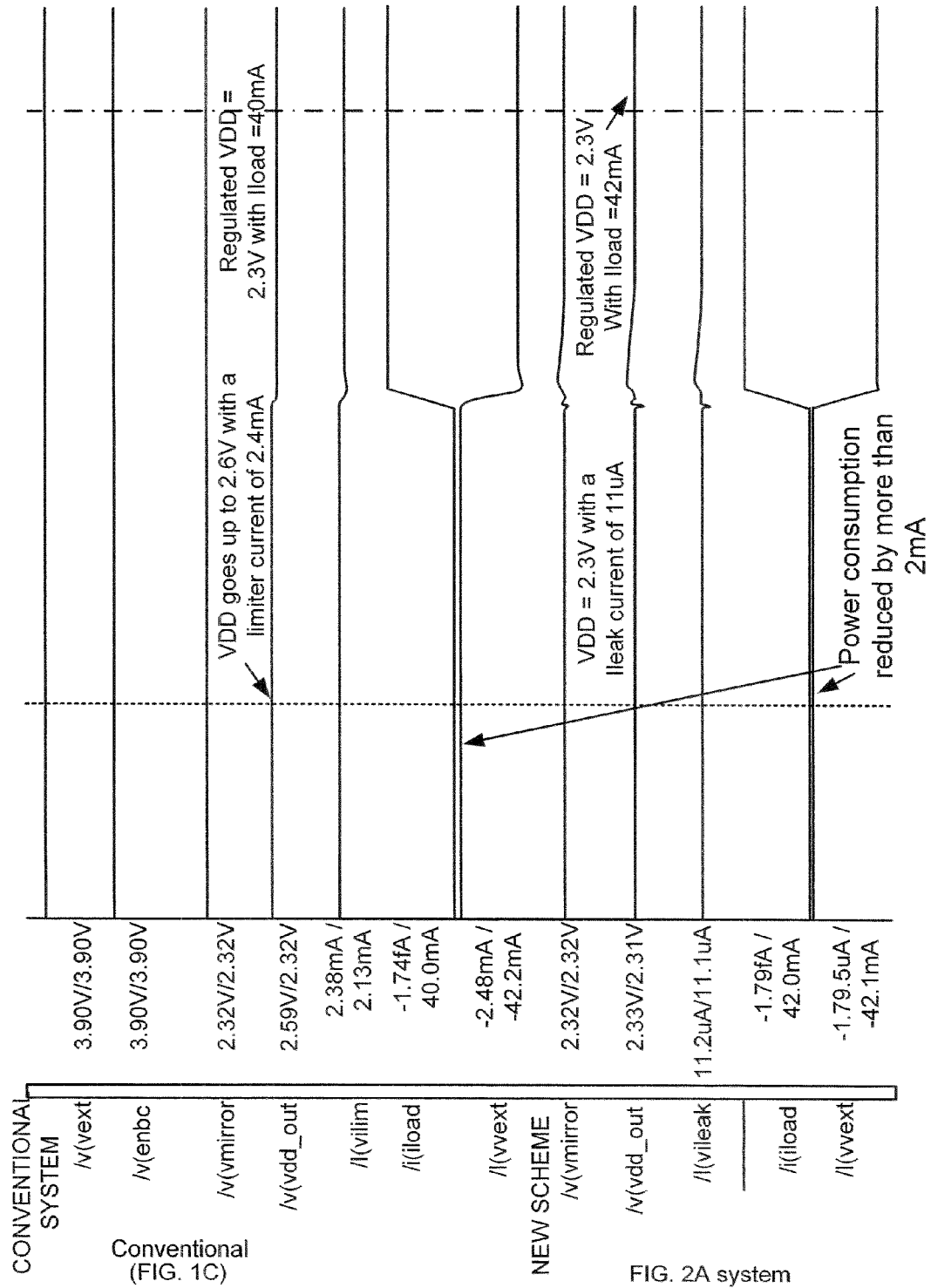
FIG. 3 graphically illustrates the differences between the voltage regulator systems of FIG. 2A and FIG. 1C.

FIG. 3 shows a graphical representation of the advantages of using the system of FIG. 2A versus the system of FIG. 1C. FIG. 3 shows the reduced power consumption; independence of VDD from a minimum value of load current (Iload); and increase in the value of maximum load current at a VDD of 2.3V. It is noteworthy that 2.3V is only shown as an example, and the adaptive aspects of the present invention are not limited to any particular voltage value.

Although the present invention has been described with reference to specific embodiments, these embodiments are illustrative only and not limiting. Many other applications and embodiments of the present invention will be apparent in light of this disclosure and the following claims.

What is claimed is:

1. A system for controlling voltage in a non-volatile memory system, comprising:
    a voltage regulator that monitors an output voltage (VDD) subject to a varying load current and a mirror voltage (Vmirror); and a control signal turns off a control transistor when the load current decreases below a threshold value, which prevents the voltage VDD to increase beyond a certain value.

2. The system of claim 1, wherein an amplifier of the voltage regulator monitors the voltage Vmirror and the voltage VDD and generates the control signal to turn off the control transistor.

3. The system of claim 1, wherein the amplifier is turned off, when the load current is substantially zero.

4. The system of claim 1, wherein the output voltage (VDD) is equal to the voltage Vmirror after the control signal has turned off the control transistor.

* * * * *